US011907033B2

(12) United States Patent
Chew et al.

(10) Patent No.: US 11,907,033 B2
(45) Date of Patent: Feb. 20, 2024

(54) ADAPTIVE POWER-ON-RESET GENERATOR SYSTEMS AND METHODS FOR PROGRAMMABLE LOGIC DEVICES

(71) Applicant: Lattice Semiconductor Corporation, Hillsboro, OR (US)

(72) Inventors: Chwei-Po Chew, San Jose, CA (US); Bradley A. Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 17/832,496

(22) Filed: Jun. 3, 2022

(65) Prior Publication Data

US 2022/0291731 A1    Sep. 15, 2022

Related U.S. Application Data

(63) Continuation of application No. PCT/US2020/063508, filed on Dec. 5, 2020.

(60) Provisional application No. 62/944,457, filed on Dec. 6, 2019.

(51) Int. Cl.
*G06F 1/24* (2006.01)
*G06F 1/28* (2006.01)
*H03K 17/22* (2006.01)

(52) U.S. Cl.
CPC .................. *G06F 1/24* (2013.01); *G06F 1/28* (2013.01); *H03K 17/223* (2013.01)

(58) Field of Classification Search
CPC ....................................................... G06F 1/24
USPC ........................................................ 327/142
See application file for complete search history.

(56) References Cited

U.S. PATENT DOCUMENTS

| 5,602,502 | A  | 2/1997 | Jiang |
| 6,040,722 | A  | 3/2000 | Lee |
| 7,015,732 | B1 | 3/2006 | Holloway et al. |
| 7,348,815 | B2 | 3/2008 | Chou |
| 8,410,833 | B2 | 4/2013 | Nix et al. |
| 8,810,289 | B1 | 8/2014 | Wang |
| 10,193,545 | B1 | 1/2019 | Pankratz et al. |
| 2006/0066367 | A1 | 3/2006 | Zolfaghari |
| 2006/0103437 | A1 | 5/2006 | Kang |

(Continued)

FOREIGN PATENT DOCUMENTS

| EP | 2 408 111 | 1/2012 |
| KR | 10-2013-0062911 | 6/2013 |

*Primary Examiner* — Tomi Skibinski
(74) *Attorney, Agent, or Firm* — Haynes and Boone, LLP

(57) ABSTRACT

Systems and methods for providing adaptive power on reset (POR) signals for use with programmable logic devices (PLDs) and/or other semiconductor devices are disclosed. An example adaptive POR signal generator includes a logic device configured to detect a first supply voltage ramp traversal across a first threshold ramp voltage, detect a second supply voltage ramp traversal across a second threshold ramp voltage, and generate a POR signal based, at least in part, on a nominal operating voltage associated with the power supply and/or the supply voltage and/or on a ramp time associated with the first and second supply voltage ramp traversals. The second threshold ramp voltage is higher than the first threshold ramp voltage and the first and second threshold ramp voltages are lower than the nominal operating voltage.

20 Claims, 6 Drawing Sheets

(56) References Cited

U.S. PATENT DOCUMENTS

2009/0089605 A1* 4/2009 Westwick ............ H03K 17/223
    713/340
2013/0293273 A1    11/2013 Paul
2016/0072322 A1* 3/2016 Yoshimatsu ...... H02J 7/007182
    361/86

* cited by examiner

ADAPTIVE POWER-ON-RESET GENERATOR SYSTEMS AND METHODS FOR PROGRAMMABLE LOGIC DEVICES

CROSS-REFERENCE TO RELATED APPLICATIONS

This patent application is a continuation of International Application No. PCT/US2020/063508, filed Dec. 5, 2020 and entitled "ADAPTIVE POWER-ON-RESET GENERATOR SYSTEMS AND METHODS FOR PROGRAMMABLE LOGIC DEVICES", which is claimed for the benefit of and incorporated herein by reference in its entirety.

International Application No. PCT/US2020/063508 claims priority to and the benefit of U.S. Provisional Patent Application No. 62/944,457 filed Dec. 6, 2019 and entitled "ADAPTIVE POWER-ON-RESET GENERATOR SYSTEMS AND METHODS FOR PROGRAMMABLE LOGIC DEVICES", which is hereby incorporated by reference in its entirety.

TECHNICAL FIELD

The present invention relates generally to programmable logic devices and, more particularly, to power-on-reset signal generators for such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

PLDs may be used to control and/or be integrated with large array of different types of user devices, and both the PLDs and other circuitry and/or circuit elements of the user device can be subjected to a relatively wide range of different supply voltages (e.g., VCC, generally between 1.2 v and 3.3 v, +/−10%). Such supply voltages are typically stable during operation of the user device/PLD, but supply voltages can vary (e.g., ramp, or be set initially to one power on value and then ramp to an operational value) during a typical power on sequence for the user device and/or the PLD. Moreover, PLDs and/or other logic devices fabricated using advanced integrated circuit processes (e.g., 28 nm fully depleted silicon-on-insulator—FDSOI—processes) may be implemented with I/O transistors (e.g., relatively thick gate transistors) and/or other circuit elements that can only tolerate up to approximately 1.8 v+/−10% (e.g., source/drain Vds, gate/source Vgs, gate/drain Vgd voltages) and guarantee an operational lifespan of at least 10 years without incurring reliability issues. Thus, there is a need in the art for systems and methods to provide supply voltage protections for PLDs, particularly during power on of a PLD and/or a user device controlled by and/or integrated with the PLD.

Figure 1:
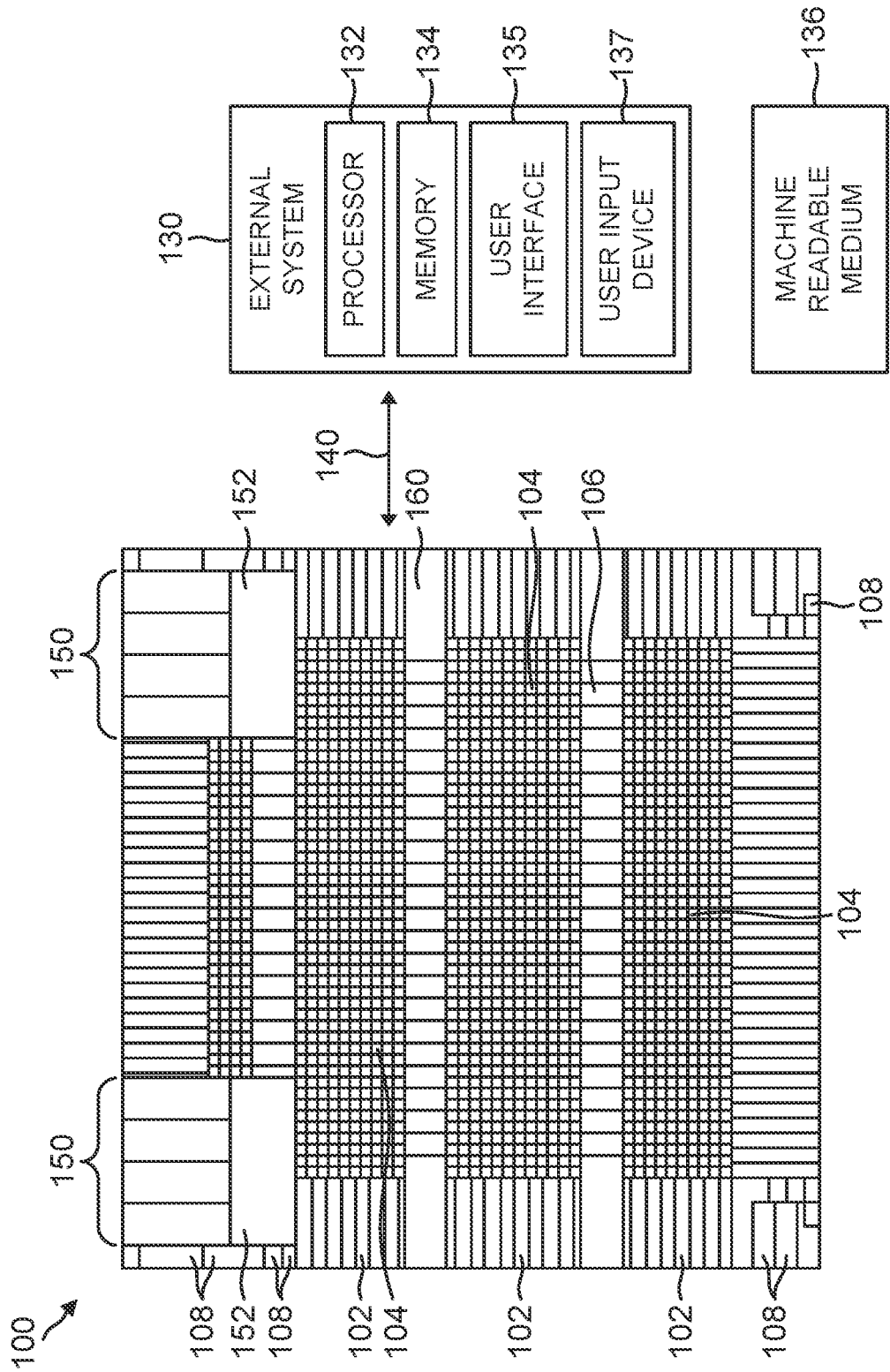
FIG. 1 illustrates a block diagram of a programmable logic device (PLD) in accordance with an embodiment of the disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure provides systems and methods for providing adaptive power on reset (POR) signal generation to protect a programmable logic device (PLD) and/or other circuit elements for use in or with various user devices for computing applications and architectures, as described herein. For example, semiconductor circuits are often located in systems or other devices that are turned on and off. While to a person, turning power on in (or providing power to) a device or system with semiconductor circuits in it can be seen as an instantaneous event, that is not strictly true within the timeframes and power domains of the system or device containing the semiconductor circuits. When a system or device is turned on, power may not be instantaneously available to every component in the device or may not be available at a desired level or stability for each and every component to operate. Devices and systems may hold semiconductor chips or components in a reset state until an appropriate power supply is available. A POR signal may be used to indicate availability of an appropriate power supply voltage for a particular chip or group of chips in a device or system. A given POR signal may be generated by a particular chip for itself, for example, or may be generated for use by a number of chips, as described herein.

In various embodiments described herein, it is desirable to allow a chip, or certain portions of a chip, or a system, to turn on as quickly as possible. However, allowing a chip or other circuitry to turn on before it has a suitable power source risks causing malfunction or damage to that circuitry and/or the chip. Moreover, particularly with respect to a PLD or other circuit element meant to be integrated with a variety of different user devices and/or according to a variety of different applications, such chip may be provided multiple supply voltages, and in various embodiments, adaptive POR signal generators described herein provide for targeting relatively fast turn-on of certain portions of a chip (or of a subset of circuitry in a chip, device or system). Such aspects include situations where it is desirable to speed up system configuration, bring up I/O functionality, and/or begin configuration of a device, or to begin to initiate control functionality. For some applications (such as where certain parts of a chip may turn on before others (e.g., such as I/O circuitry before a core logic portion), allowing POR release too early can cause a current inrush while other supplies are ramping, which can damage and/or otherwise reduce the lifetime of circuitry.

Providing a relatively simple fixed delay (such as based one worst case expected voltage ramp) from initially detecting application of a voltage to an integrated circuit before generating a POR signal does not permit adaptability to fast ramping and/or variable ramping power supplies. An integrated circuit that has a voltage rail or power supplied from a fast ramping supply could potentially turn on sooner if provided a POR signal that could adaptively support both slow and fast-ramping power supplies. However, it is not necessarily desired to design a user device or chip to always require a fast-ramping power supply because such power supplies may be more expensive, require more strict design rules, and/or may have other relatively complex design constraints. Therefore, it is desirable to employ an adaptive POR signal generator, according to embodiments described herein, that can adapt to a variety of power supply slew rates/ramp rates when generating a POR signal. Integrated circuits including an adaptive POR signal generator are therefore significantly more flexible than conventional circuit elements with respect to common system design constraints, including both overall system cost and performance.

In one embodiment, an integrated circuit can turn on certain input/output (I/O) circuits sooner with an adaptive POR signal generator, as described herein, which can generally increase overall system performance, security (e.g., by ensuring security measures are functioning before elements of the system are compromisable in-situ), and reliability (e.g., by helping to ensure circuits aren't damaged or otherwise degraded over time by power on events). Such integrated/semiconductor circuits according to the present disclosure can be any one or combination of Application Specific Integrated Circuits (ASICs), System on Chip (SOCs), PLDs (including Field Programmable Gate Arrays (FPGAs)). In various embodiments, an adaptive POR signal generator as described herein may be configured to generate a POR signal for a part of an integrated circuit (e.g., one or more power or voltage domains on one chip), an entire integrated circuit located on one substrate, or multiple integrated circuits across multiple substrates that could be located in the same package, such as with Through Silicon Via (TSV) technology, side-by-side packages connected via interconnect, or other such technologies, or multiple integrated circuits in different chips. Multiple functional elements in an SOC could receive a POR signal generated according to the present disclosure, as described herein.

For example, PLDs can be integrated into and/or configured to control a wide array of different user devices, each with varying supply voltage requirements, generally selected to be one or more of 1.2 v, 1.5 v, 1.8 v, 2.5 v, and 3.3 v. To increase flexibility of a particular PLD, each user device or PLD may be implemented with an adaptive POR signal generator configured to prevent the PLD, elements of the PLD, and/or other elements of the user device from operating before the supply voltage reaches a minimum compatible operating voltage, including during power on states, where the various supply voltages provided to the PLD and/or other elements of the user device ramp to their operating levels.

In general, an adaptive POR signal generator may be implemented by a logic device/controller configured to measure a ramp rate of a supply voltage prior to the supply voltage reaching its nominal operating voltage and generate a POR signal roughly coincident with the supply voltage reaching its nominal operating voltage based, at least in part, on the measured ramp rate and/or ramp rate characteristics. In particular embodiments, an adaptive POR signal generator may include a counter or other timing device, for example, and the logic device may be configured to use the counter to measure a ramp time between at least first and second ramp voltages of the supply voltage and generate the POR signal based, at least in part, on that ramp time measurement, where the first and second ramp voltages of the supply voltage are selected to be lower than the nominal operating voltage.

As described herein, a POR signal generator may be coupled to and/or integrated with a PLD, which may itself include various circuit elements and/or a user design configured to facilitate operation of the POR signal generator and/or a coupled user device. In accordance with embodiments set forth herein, techniques are provided to manage implementation of user designs in PLDs. In various embodiments, a user design may be converted into and/or represented by a set of PLD components (e.g., configured for logic, arithmetic, or other hardware functions) and their associated interconnections available in a PLD. For example, a PLD may include a number of programmable logic blocks (PLBs), each PLB including a number of logic cells, and configurable routing resources that may be used to interconnect the PLBs and/or logic cells. In some embodiments, each PLB may be implemented with between 2 and 16 or between 2 and 32 logic cells.

In general, a PLD (e.g., an FPGA) fabric includes one or more routing structures and an array of similarly arranged logic cells arranged within programmable function blocks (e.g., PFBs and/or PLBs). The purpose of the routing structures is to programmably connect the ports of the logic cells/PLBs to one another in such combinations as necessary to achieve an intended functionality. A remote PLD may include various additional "hard" engines or modules configured to provide a range of remote management functionality that may be linked to operation of the PLD fabric to provide configurable computing functionality and/or architectures. Routing flexibility and configurable function embedding may be used when synthesizing, mapping, placing, and/or routing a user design into a number of PLD components. As a result of various user design optimization processes, a user design can be implemented relatively efficiently, thereby freeing up configurable PLD components that would otherwise be occupied by additional operations and routing resources. In some embodiments, an optimized user design may be represented by a netlist that identifies various types of components provided by the PLD and their associated signals. In embodiments that produce a netlist of the converted user design, the optimization process may be performed on such a netlist. Once optimized, such configuration may be loaded into a PLD and the PLD may boot and execute the configuration, which may include the use of various I/O buses to communicate with a user device, as described herein.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). More generally, the individual elements of PLD 100 may be referred to as a PLD fabric.

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine-readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
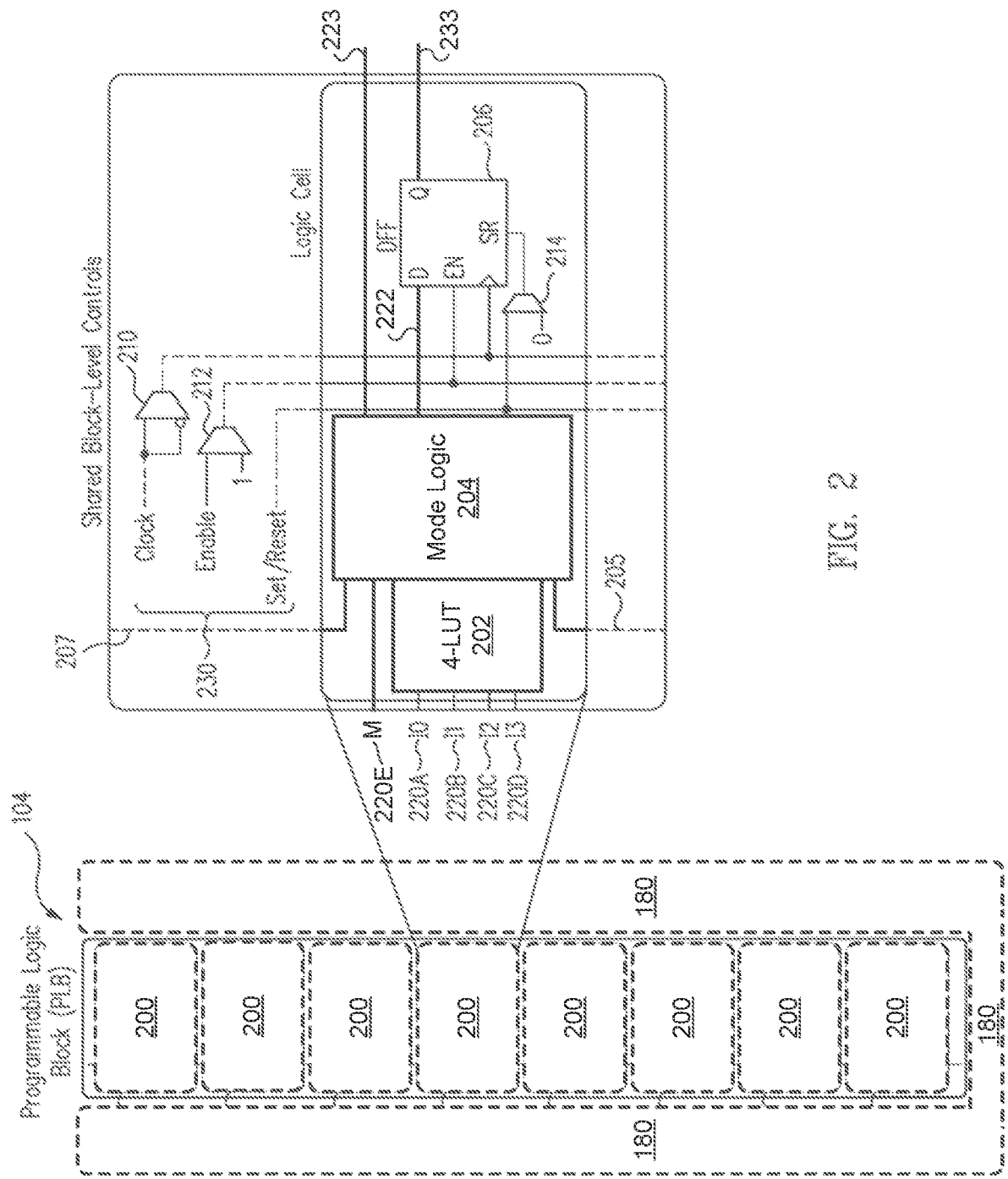
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality. In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode Logic 204 may include various logic elements and/or additional inputs, such as input 220E, to support the functionality of various modes, as described herein. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202). Moreover, logic cells 200 may be implemented with multiple outputs and/or interconnections to facilitate selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers, as described herein. In some embodiments, mode logic circuits 204 may be chained across multiple logic blocks 104.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200, fewer logic blocks 104, and/or with less burden on routing resources 180 when PLD 100 is configured to implement the user design. Such adjustments according to various embodiments may identify certain logic, arithmetic, and/or extended logic operations, to be implemented in an arrangement occupying multiple embodiments of logic cells 200 and/or logic blocks 104. As further described herein, an optimization process may route various signal connections associated with the arithmetic/logic operations described herein, such that a logic, ripple arithmetic, or extended logic operation may be implemented into one or more logic cells 200 and/or logic blocks 104 to be associated with the preceding arithmetic/logic operations.

Figure 3:
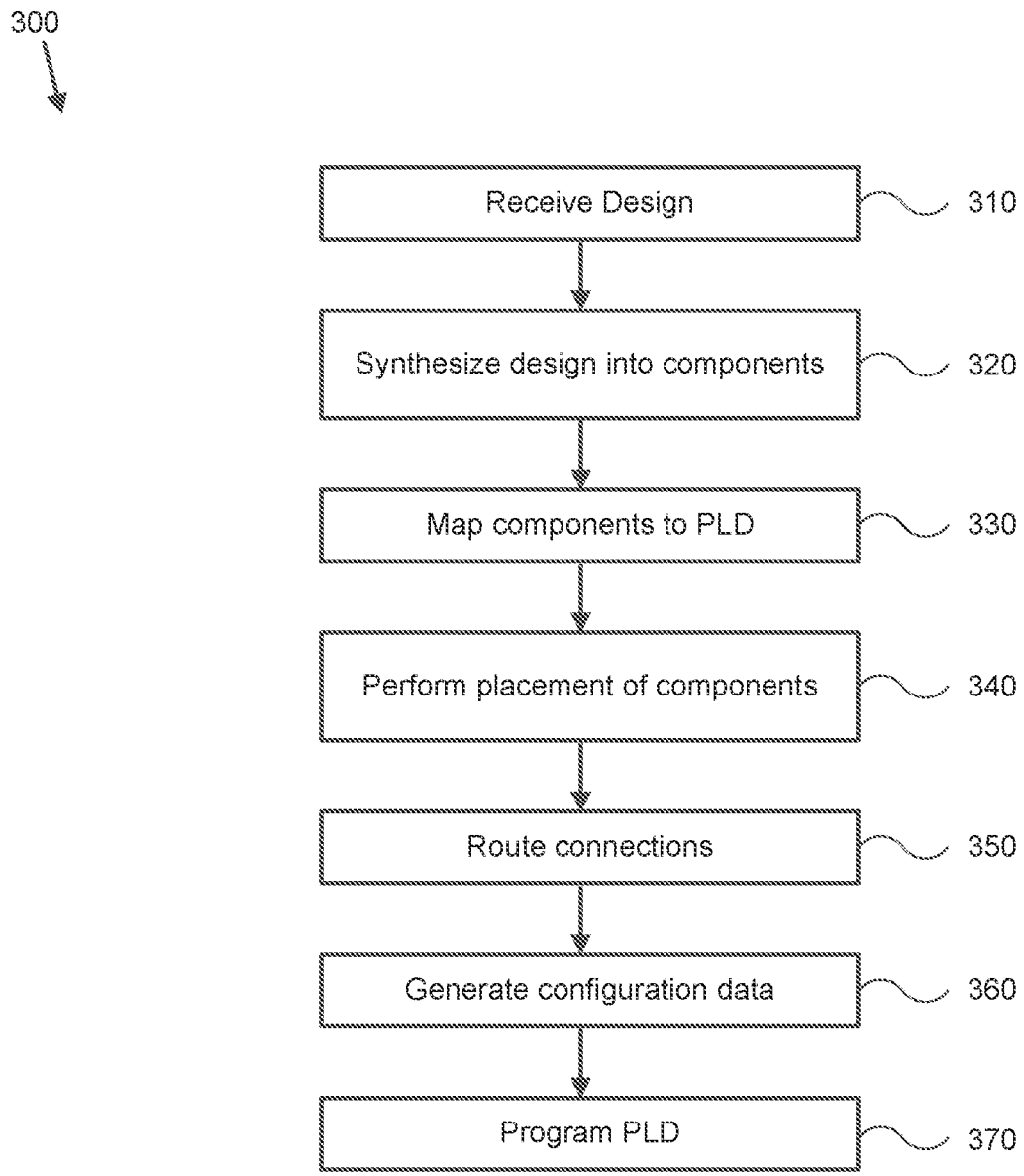
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise. In various embodiments, such files and/or information may be encrypted or otherwise secured when stored and/or conveyed to PLD 100 and/or other devices or systems.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components), which may include both programmable components and hard IP components of PLD 100. In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In another example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, routing resources 180, and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In another example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In various embodiments, such configuration data may be encrypted, signed, and/or otherwise protected as part of such generation process, as described more fully herein. In operation 370, system 130 configures PLD 100 with the configuration data by, for example, loading a configuration data bitstream (e.g., a "configuration" or "configuration image") into PLD 100 over connection 140. Such configuration may be provided in an encrypted, signed, or unsecured/unauthenticated form, for example, and PLD 100 may be configured to treat secured and unsecured configurations differently, as described herein.

Figure 4:
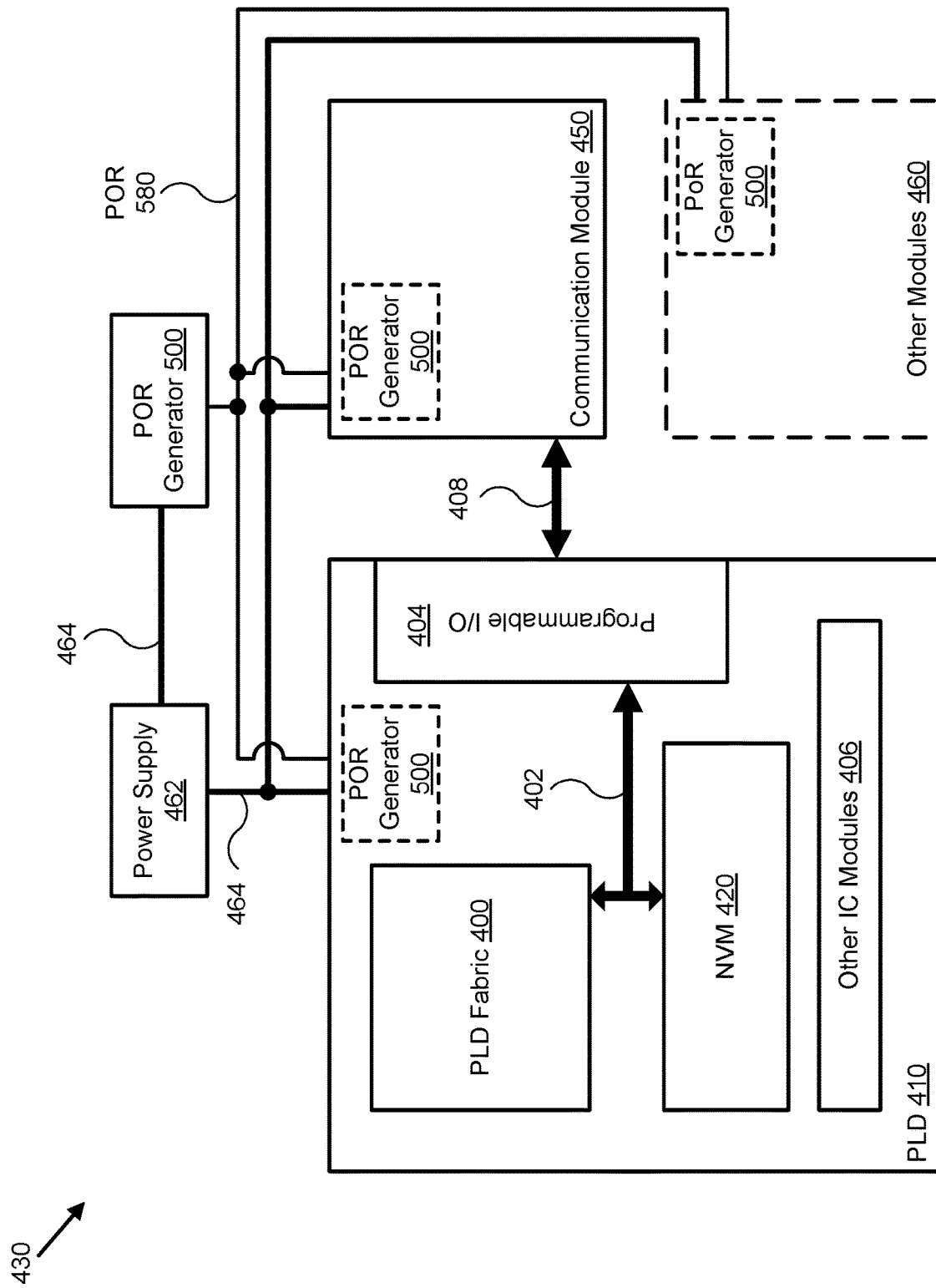
FIG. 4 illustrates a block diagram of a user device including a PLD and one or more adaptive power on reset (POR) signal generators in accordance with an embodiment of the disclosure.

FIG. 4 illustrates a block diagram of a user device 430 including a PLD 410 and one or more adaptive power on reset (POR) signal generators 500 in accordance with an embodiment of the disclosure. In various embodiments, user device 430 may include power supply 462, adaptive POR signal generator 500, and one or more electronic components facilitating operation of user device 430, such as PLD 410, communication module 450, and other user device modules 460 configured to facilitate remote management of PLD 410, for example, or to facilitate a particular user device application, as described herein. In various embodiments, user device 430 may be implemented as a smart phone, a laptop computer, a tablet computer, a desktop computer, a smart environmental sensor, a home automation device (e.g., sensor and/or actuator), a network management device, a smart display or television, an automobile user interface, and/or other user device, as described herein. More generally, user device 430 may be implemented as an embedded device or any other computing or electronic device integrable with one or more of PLD 410.

As shown in FIG. 4, power supply 462 may be configured to provide one or more supply voltages (e.g., one or more VCCs, VAUXs) to various components of user device 410 over power buses 464. For example, power supply 462 may be implemented as a battery or battery bank, for example, with integrated charging and monitoring electronics. In other embodiments, power supply 462 may be configured to receive grid or other external power and include various power conditioning, regulating, and/or conversion components configured to provide the appropriate operating voltage for each component of user device 430 using one or more of power buses 464. Power buses 464 may be include one or more conductive wires and/or traces configured to convey such supply voltages to the various components, as shown, and may in some embodiments include signaling traces configured to transmit and receive logic signals/data facilitating operation of power supply 462, user device 430, and/or the various elements of user device 430. In some embodiments, power buses 464 may be configured to provide the same supply voltages to one or more adaptive POR generators 500, as shown.

In various embodiments, adaptive POR signal generator 500 may be configured to receive one or more supply voltages from power supply 462 over a power bus 464 and generate a POR signal configured to release a restart state of one or more components of user device 430 approximately when a corresponding supply voltage reaches a minimum compatible operating voltage for the one or more components. As shown in FIG. 4, in some embodiments, such POR signal may be conveyed to each component via POR signal buses 580, and each device may include circuitry configured to maintain a reset or power safe state of the component until a POR signal is received over POR signal bus 580. For example, a POR signal may be a logic signal that transitions (e.g., from high to low, from low to high, from low to high to low, etc.) to release such restart state, and the corresponding component receiving such signal may be configured to latch or store such restart release state until user device 430 and/or power supply 462 are power cycled, for example, or adaptive POR signal generator 500 generates a forced reset signal (e.g., a separate logic signal transition also conveyed over POR signal buses 580) configured to force corresponding components back into a reset state, as described herein.

In some embodiments, each component may include its own optional adaptive POR signal generator 500, for example, so as to increase the design flexibility of the individual component with respect to power supply performance characteristics, operating voltages, and corresponding ramp times. More generally, user device 430 may include any combination of adaptive POR signal generators 500 configured to protect operation of user device 430 and elements of user device 430, for example, and, at the same time maintain relatively high system performance by minimizing the delay between power on of power supply 462 and operation of user device 430 and/or individual elements of user device 430 (e.g., minimize boot time under variable conditions).

As shown in FIG. 4, PLD 410 may be implemented by elements similar to those described with respect to PLD 100 in FIG. 1, and/or with additional configurable and/or hard IP elements configured to facilitate operation of PLD 410 in a particular computing application and/or architecture, as described herein. In particular, PLD 410 may include a PLD fabric 400 linked by various buses to a non-volatile memory (NVM) 420, a programmable I/O 404, and/or other integrated circuit (IC) modules 406, all implemented on a monolithic IC, as shown. In general, PLD fabric 400 may be implemented by any of the various elements described with respect to PLD 100 and may be configured using a design process similar to design process 300 described in relation to FIG. 3 to generate and program PLD fabric 400 according to a desired configuration. In some embodiments, PLD 410 may include one or more adaptive POR signal generators 500 (e.g., as one or more hard IP components integrated with PLD 410).

NVM 420 may be implemented as a hard IP resource configured to provide securable and/or non-volatile storage of data used to facilitate operation of PLD 410. NVM 420 may include multiple differentiated sectors, such as one or more configuration image sectors, a device key sector (e.g., an AES key sector and a separate public key/key pair sector), a user flash memory (UFM) sector, and/or other defined storage sectors. Configuration image sectors may each store a configuration for PLD fabric 400, for example, so as to allow them to be selected (e.g., based on version or date) and used to program PLD fabric 400. A trim sector may be used to store manufacturer trim, device identifier, device category identifier, and/or other data specific to a particular PLD 410, for example, such as a modifiable customer-specific ordering part number and/or a generated customer ID number. Device key sectors may be used to store encryption/decryption keys, public/private keys, and/or other security keys specific to a particular PLD 410. UFM sectors may be used to store user data generally accessible by PLD fabric 400, such as configurations or application-specific security keys, certificates, and/or other secure(d) user data. Any one or more individual elements, portions, or sectors of NVM 420 may be implemented as configurable memory, for example, or one-time programmable (OTP) memory, as described herein.

Programmable I/O 404 may be implemented as at least partially configurable resources and/or hard IP resources configured to provide or support a communications link between PLD fabric 400 and an external controller, memory, and/or other device, such as communication module 450, for example, across bus 402 (e.g., a bus configured to link portions of PLD fabric 400 to programmable I/O 404 and/or NVM 420) and according to one or more external bus interfaces, protocols, and/or bus supply voltages (e.g., external bus interface 408). Programmable I/O 404 may also be configured to support communications between PLD fabric 400 and/or NVM 420 across bus 402 and/or external bus interface 408 with communication module 450, for example, in addition or as an alternative to external system 130/ machine readable medium 136, as described herein.

In some embodiments, bus 402 and/or programmable I/O 404 may be integrated with PLD fabric 400. More generally, one or more elements of PLD 410 shown as separate in FIG. 4 may be integrated with and/or within each other. Other IC modules 406 may be implemented as hard and/or configurable IP resources configured to facilitate operation of PLD 410. For example, other IC modules 406 may include a security engine implemented as a hard IP resource configured to provide various security functions for use by PLD fabric 400 and/or user device 430, a configuration engine implemented as a hard IP resource configured to manage the configurations of and/or communications amongst the various elements of PLD 410, including to manage or control configurations of elements of PLD 410, boot of PLD fabric 400, and flow control throughout PLD 410, one or more additional external access busses implemented according to one or more of a JTAG, I2C, SPI, and/or other external access bus or protocol, for example, configured to provide access to and/or from communication module 450 and/or other user device modules 460.

Communication module 450 may be implemented as a network communications IC configured to form communications links to a remote external device used to manage operation of PLD 410. For example, in some embodiments, communication module 450 may be implemented as a wireless communication module configured to support a wired and/or wireless communications link (e.g., formed according to WiFi, Bluetooth, Zigbee, Zwave, near-field communication (NFC), cellular, Ethernet, and/or other open and/or proprietary wired and/or wireless communication protocols) to a communications network, as described herein. In such embodiments, communication module 450 may be configured to manage various security features of such wired and/or wireless communications link (e.g., establishing communications link credentials, employing communications link credentials to establish a communications link, negotiating encryption keys for encrypted communications tunnels established over such communications link, such as transport layer security (TLS)), for example, and/or may be configured to be controlled by PLD 410 and/or other user device module 460 to manage such security features.

Other user device modules 460 may include various computing, sensor, and/or actuator elements configured to implement a particular user device application, for example, such as a remote sensor application, a remote controller application, and/or a remote computing application, as described herein. Other user device modules 460 may also include various other communication buses, power storage and delivery elements, user interfaces (e.g., buttons, keyboard, mouse, track pad, and/or displays/touch screen displays) to support such user device applications. In one embodiment, other user device modules 460 includes an electrical characteristic sensor configured to detect and/or measure an electrical state of a transducer element (e.g., also an element of other user device modules 460) that is used to measure an environmental condition associated with user device 430. In another embodiment, other user device modules 460 includes various electronic devices typically found within a smart phone, a laptop computer, a tablet computer, and/or a desktop computer.

Figure 5:
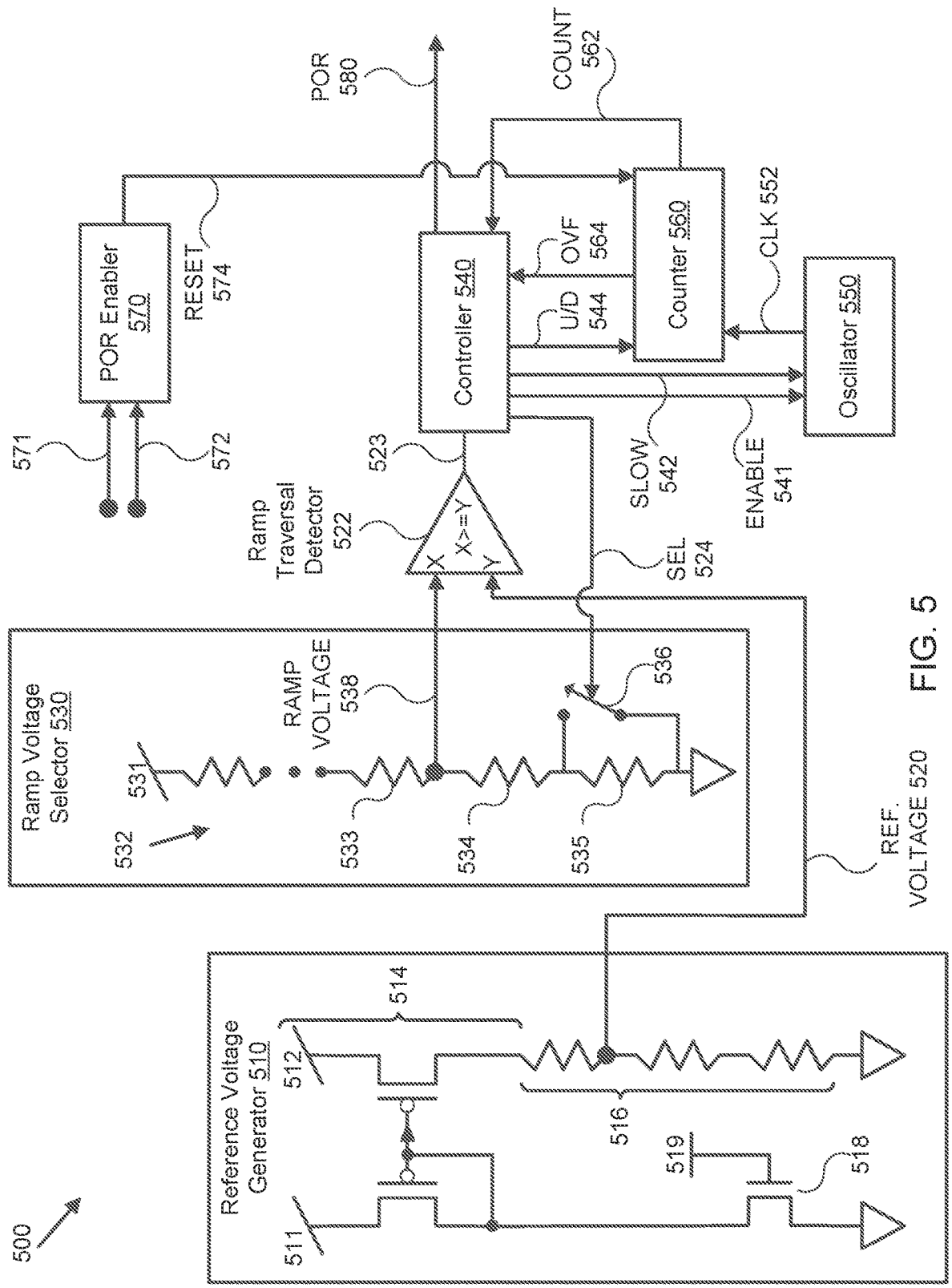
FIG. 5 illustrates a block diagram of an adaptive POR signal generator in accordance with an embodiment of the disclosure.

FIG. 5 illustrates a block diagram of adaptive POR signal generator 500 in accordance with an embodiment of the disclosure. Operation of adaptive POR signal generator 500 in FIG. 5 will be described with respect to an example supply voltage (or a voltage derived from a supply voltage) that is nominally about 1.9 v when fully ramped. However, embodiments are adaptable to any supply voltage, and any particular values are merely examples from which those of ordinary skill in the art can understand how to apply aspects of the disclosure to other implementations. An example supply voltage can be referred to as VCC. In general operation, the supply voltage (e.g., a VCC) that is ramping is sampled (e.g., referred to herein also as a ramp voltage when sampled during ramp, according to various different sampling techniques) as it increases from a relatively low first threshold ramp voltage (e.g., Vl~1.38 v) to a relatively high second threshold ramp voltage (e.g., Vh~1.58 v) in order to characterize a ramp time required to ramp through the monitored supply voltage range.

In general, both the first threshold ramp voltage Vl and the second threshold ramp voltage Vh should be less than the desired fully ramped supply voltage (e.g., the minimum compatible operating voltage for the corresponding component). The first threshold voltage level Vl can be selected to be high enough to avoid an early turn on period of power supply 462 in which there may be transients or other undesirable and/or unreliable power supply behavior. In various embodiments, the ramp time can be characterized by counting transitions of an embedded oscillator/clock source with a known frequency Fon. A time for each transition, or a count based on a number of such transitions, can be determined based on the known clock frequency Fon. In some implementations, an assumption of monotonic ramping of the supply voltage may be made or required in order to characterize both the ramp time and any delay needed to properly generate a resulting POR signal, as described herein.

In embodiments including a counter as the timing device, in order to appropriately delay generation of a POR signal, the value of the counter when VCC has ramped to Vh can be used as the basis for determining when the POR signal should be generated. In some embodiments, if the count was started at zero to represent the ramp time of ramping between Vl and Vh, then the POR signal delay to release reset (e.g., to generate the POR signal) may be calculated based on how far Vh is away from a desired fully-ramped operating voltage, for example, or a value at which the circuit or portion thereof can operate). For instance, if the operating voltage value for supply voltage VCC is desired/expected to be 1.98 v, then the POR signal should be generated (reset released) when VCC is about 1.98 v. Assuming a linear ramp rate for supply voltage VCC, if Vl=1.38 v and Vh=1.58 v (meaning a change in voltage level of about 0.2 v), then the voltage change between Vh and the final value of VCC is about 0.4 volts or twice the voltage difference between the two threshold ramp voltages Vl and Vh. Therefore, under such conditions, the POR signal delay between reaching Vh and POR signal generation should be about twice the ramp time between VCC reaching Vl and then reaching Vh.

In one embodiment, the value of the counter when VCC reaches Vh (e.g., a ramp time count, at a given counter frequency, Fon) may be used to implement the POR signal delay (e.g., in this numerical example, by doubling the count value or halving the Fon frequency), for example, and may be used to determine precisely when to generate the POR signal. For instance, in some embodiments, the POR signal can be generated by counting down from the counter value (e.g., the determined ramp time count) at a frequency of Fon/2 based on the above-described voltages and a linear ramp assumption. More generally, other values for Vl and Vh can be selected, and/or Fon can be selected based on a number of bits to be allocated or available for the counter. Also, the POR signal delay to POR signal generation may be adjusted by modifying the countdown frequency or modifying the count value. Countdown frequency can be modified by changing a resistance value for the counter and/or clock source/oscillator, which may be done (e.g., at manufacture) by selecting from among several resistances, by changing a metal layer, or other appropriate means (e.g., laser trimming), or by implementing a variable resistor or other programmable circuit element (e.g., which may be adjusted programmatically during operation of adaptive POR signal generator 500). In various embodiments, a POR signal delay can be modified to account for process and temperature variations, for example, which may be monitored and provided to adaptive POR signal generator 500 over power supply buses 464 and/or POR signal buses 580. A margin of safety or other POR signal delay adjustment can be modified on an ongoing basis based on observed or possible non-linearities in ramp rates of VCC, for example, and the POR signal delay may be determined based on any linear or nonlinear ramp rate profile produced by and/or expected from power supply 462, for example, and/or measured by adaptive POR signal generator 500, as described herein.

In some embodiments, adaptive POR signal generator 500 may be implemented to be simple and robust. The example implementation architecture presented in FIG. 5 illustrates aspects of the disclosure that provide POR signal generation (reset release) with adaptive timing based on voltage ramp rate in a relatively simple, compact, reliable, and low power embodiment. For example, the embodiment of adaptive POR signal generator 500 depicted in FIG. 5 may be used with any or multiple supply voltages—internally and/or externally sourced or generated, and an amount of POR signal delay may be ramping rate dependent. With the example voltage values disclosed above, and a fast ramping (20 us/v), POR signal delay in this example would be near 30 us (microseconds), while with slow ramping (50 ms/v), POR signal delay would be around 20 ms. The POR signal delay can be varied by varying oscillator frequency. An amount of POR signal delay supported can be varied by changing the number of available bits of the counter. The available oscillator frequencies can be varied by modifying resistance (metal option) or bondout option, for example. Output of the POR signal on POR signal bus 580 can be further processed (for example, OR-ed and/or AND'ed with one or more other signals) as required for the particular application of the POR signal being generated. A number of bits in the counter can be selected based on the maximum necessary or desired or expected POR signal delay to be supported. In one example, a 17-bit counter is sufficient to support a maximum POR signal delay required for a minimum allowable ramp rate (e.g., where ramp rates lower than the minimum allowable ramp rate tend to indicate a malfunctioning power supply 462). A timeout feature can be included, where if the ramping supply/ramp voltage does not reach the second threshold ramp voltage Vh within a required time period (which can be indicated by the counter rolling over and generating an overflow logic signal), then a system/power supply/chip/POR signal generator restart signal can be generated to attempt a system/power supply/chip/POR signal generator restart, generate an alert, and/or power down. In various embodiments, a monotonic voltage ramp in the monitored power supply voltage is assumed, but in alternative embodiments, relatively noisy DC supply voltages and/or AC supply voltages may be accommodated by including appropriate filtering and/or monitoring circuitry (e.g., AC voltage peak monitoring circuitry) within adaptive POR signal generator 500.

FIG. 5 depicts circuitry of adaptive POR signal generator 500 that can be formed in a semiconductor as an integrated circuit or part of one. Such integrated circuit can be one integrated circuit of a number of separate and/or interconnected circuits formed on such semiconductor. In the embodiment depicted in FIG. 5, in general operation, a reference voltage 520 is produced by a reference voltage generator 510, which may then be supplied to ramp traversal detector 522. Ramp traversal detector 522 may then generate a ramp traversal signal 523 and provide it to controller 540, which may be configured to determine an appropriate POR signal delay with which to generate a POR signal on POR signal bus 580.

Controller 540 may be may be implemented as any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a control loop for controlling various operations of adaptive POR signal generator 500, for example. Such software instructions may also implement methods for querying devices for operational parameters, selecting operational parameters for devices, or performing any of the various operations described herein (e.g., operations performed by logic devices of various devices of adaptive POR signal generator 500). In addition, controller 540 may be implemented with a machine-readable medium for storing non-transitory instructions for loading into and execution by controller 540. In these and other embodiments, controller 540 may be implemented with other components where appropriate, such as volatile memory, non-volatile memory, one or more interfaces, and/or various analog and/or digital components for interfacing with devices of adaptive POR signal generator 500 and/or user device 430.

As shown in FIG. 5, reference voltage generator 510 may be implemented by a current mirror 514 that can be enabled/turned on by bandgap transistor structure 518 and a linear resistor array 516 configured to provide a selected reference voltage based on the current output of current mirror 514. In some embodiments, current mirror 514 may be coupled to and/or powered by any available supply voltage, such as VCC and/or VAUX, for example, at inputs 511 and 512, and bandgap transistor structure 518 may be gated by a bandgap signal at input 519 (e.g., conveyed via power bus 464 and/or POR signal bus 580), which may be configured to indicate that a supply voltage generated by power supply 462 (e.g., and provided to inputs 511 and/or 512) is available to power current mirror 514 and generate a stable and reliable reference voltage 520.

In some embodiments, reference voltage generator 510 is turned on by a voltage signal produced from another circuit, such as a bandgap, or even another POR generation circuit. Such voltage signal can indicate that the supply voltage at inputs 511 and/or 512 (e.g., VCC) has reached a certain minimum voltage, such as 0.7, 0.8 or 0.9 volts. Current mirror 514 thereafter produces a stable and reliable reference voltage 520 via linear resistor array 516. In various embodiments, reference voltage generator 510 may be implemented using other circuit elements and/or circuit arrangements. In general, reference voltage generator 510 may be any combination of circuit elements configured to generate a relatively stable and reliable reference voltage 520 prior to the monitored supply voltage (e.g., provided at monitored supply voltage input 531 of ramp voltage selector 530) ramping to its nominal operating voltage, for example, where reference voltage 520 may be lower than the nominal operating voltage of the supply voltage monitored by adaptive POR signal generator 500. In some embodiments, reference voltage generator 510 may be implemented by hard and/or soft IP resources integrated with PLD 410.

As shown in FIG. 5, reference voltage 520 may be supplied to ramp traversal detector 522, which may in some embodiments be implemented as a comparator. Ramp traversal detector 522 may be coupled to ramp voltage selector 530 and configured to generate a ramp traversal signal 523 when ramp voltage 530 provided by ramp voltage selector 530 traverses reference voltage 520 (e.g., when ramp voltage 530 becomes equal to and/or greater than reference voltage 520—which can be within a specified temporal/voltage tolerance or other approximation). In various embodiments, ramp traversal detector 522 may include programmable linear resistor array/voltage divider 532, which may include resistors 533, 534, and 535 and resistor bypass switch 536 configured to generate ramp voltage 538 from supply voltage input 531 (e.g. the monitored supply voltage VCC) based on a switch state of resistor bypass switch 536. For example, resistor bypass switch 536 may be configured to selectively short out resistor 535 and thereby change the range of voltages generated by ramp voltage selector and output as ramp voltage 538. As shown, programmable linear resistor array/voltage divider 532 is coupled to VCC at input 531, which as described, is ramping. Therefore, ramp voltage 530 is also increasing with increasing VCC.

In some embodiments, resistors R1/533, R2/534, R3/535 may be chosen so that ramp voltage 538 is equal to reference voltage 520 when supply voltage VCC is about 1.38V and again when VCC is about 1.58 v (e.g., when resistor bypass switch 536 is closed). In particular, ramp voltage 538 may be determined as (R2+R3)/(R1+R2+R3) when resistor bypass switch 536 is open and as (R2/(R1+R2)) when resistor bypass switch 536 is closed. Reasonable values for one or more of R1-R3 can be chosen, and then the resulting equations solved for both instances. Note that reference voltage 520 does not need to, and typically would not, equal 1.38 or 1.58 v.

In various embodiments, adaptive POR signal generator 500 may include circuity (e.g., POR enabler 570) configured to enable and disable operation of adaptive POR signal generator 500 when it is not needed, such as to save power. For example, signal input 571 (e.g., pmu_done) can indicate that a circuit receiving a POR signal from adaptive POR signal generator 500 has successfully turned on, and thus operation of adaptive POR signal generator 500 is no longer needed, while signal input 572 (e.g., bg_ready) can indicate that reference voltage 520 is ready to be (or is being) supplied to ramp traversal detector 522, such that adaptive POR signal generator 500 may be used to generate a POR signal. For example, signal input 572 may be coupled to the same bandgap signal at input 519. In some embodiments, counter 560 should be held in reset (e.g., via reset signal 574 generated by POR enabler 570) if pmu_done is logically true, regardless of bg_ready, and counter 560 should come out of reset only if bg_ready is logically true while pmu_done is logically false. In various embodiments, POR enabler 570 may be configured to implement such logic to facilitate operation, enabling, and disabling of adaptive POR signal generator 500 and/or individual elements of adaptive POR signal generator 500, as shown.

In response to ramp traversal detector 522 indicating to controller 540 via ramp traversal signal 523 that supply voltage VCC at input 531 has reached 1.38V, controller 540 initiates the output of oscillator 550 to counter 560 via various clock control signals, including clock enable signal 541. Controller 540 also can adjust a frequency of oscillator 550 via clock control signals (e.g., slow enable signal 542), as described herein. Controller 540 also can cause counter 560 to count either up or down via various counter control signals (e.g., up/down signal 544), and in this example, upon ramp voltage selector 530 indicating supply voltage VCC at input 531 is at 1.38V, counter 560 starts to count up at a frequency of the clock signal 552 output by oscillator 550 to counter 560. Upon ramp traversal detector 522 indicating to controller 540 that supply voltage VCC at input 531 has reached 1.58V, controller 540 disables oscillator 550 from providing clock signal 552 to counter 560 (e.g., via clock enable signal 541). Note that the oscillator may still be active, but simply not outputting clock signal 552. Counter 560 thus stops incrementing.

Aspects of the disclosure provide for delaying release of the POR signal by an amount dependent on how quickly supply voltage VCC ramped between the two ramp threshold voltages, referred to herein as the ramp time. In certain aspects, the POR signal delay is also determined based on how far Vh is from an expected final value of and/or nominal operating voltage for VCC. In the example presented with Vl=1.38 and Vh=1.58 (a difference of 0.2 v) and a final VCC value of 1.98, there is about 0.4 v left for VCC to increase, and so the time to release should be about twice an amount of time that was required to ramp from Vl=1.38 to Vh=1.58.

While a variety of implementations to provide the POR signal delay can be provided, in this example, the POR signal delay is implemented and/or adjusted by decreasing the oscillator frequency to about one half of the value that was used to count up. Then, controller 540 directs counter 560 to count down instead of up, at the now-reduced frequency. The current count from counter 560 can be provided to controller 540, which may be configured to detect when the count value has reached zero and responsively generate a POR signal on POR signal bus 580 that can be used as a POR signal or to generate a further logic gated POR signal (i.e., to release reset or to come out of reset). For example, POR signal on POR signal bus 580 could be used directly to release reset, or it can be consumed by another circuit that may further gate or use the POR signal on POR signal bus 580 before a POR release.

In some implementations, counter 560 also has a capability to indicate overflow (e.g., via overflow signal 564), meaning that ramp traversal detector 522 ultimately did not trigger controller 540 that ramp voltage 538 reached a value indicating VCC reached Vh. Controller 540 can use this overflow signal to take an action, which can depend on the intended usage of the POR signal. Such action can include causing the entire chip or portion of an integrated circuit to reset and try again, or a POR signal can be released anyway. In various embodiments, POR signal bus 580 may be used to convey a POR signal and/or other communicative logic signals between controller 540 and any other circuit elements services by adaptive POR signal generator 500. Other implementations may include a counter 560 that itself can trigger another signal on a value of significance such as zero, and no exact division these functions implemented by controller 540 and counter 560 is implied or required.

In general, Vl and Vh can be adjusted and a corresponding change in delay or oscillator frequency can be provided. Additionally, an amount of bits in counter 560 can be provided based on an expected range and desired resolution of oscillator 550. For example, oscillator 550 can operate at a value such as 1 MHz, or more. Then, each transition of the clock from oscillator 550 represents 1 uS. A maximum number of bits can be determined by a maximum permissible POR signal delay. For example, with 17 bits, counter can count 2^17 transitions of clock signal 552, or about 130 ms of total time (for the ramp up). More or fewer bits can be allocated, allowing more granularity and/or more range.

Also, in general, oscillator 550, counter 560, POR enabler 570, controller 540, and/or other elements of adaptive POR signal generator 500 may be implemented by hard or soft IP resources of PLD 410, for example.

In alternative or supplemental embodiments, adaptive POR signal generator 500 may be implemented by controller 540 and various circuit elements configured to sample a supply voltage provided by power supply 462 prior to the supply voltage reaching its nominal operating voltage, where controller 540 is configured to determine an appropriate POR signal delay and generate a POR signal according to the POR signal delay that roughly coincides with the supply voltage reaching it nominal operating voltage. In the embodiment shown in FIG. 5, controller 540 uses two samples of the supply voltage (e.g., as selected by ramp voltage selector 530) taken at different times and voltage levels to determine the appropriate POR signal delay. In alternative embodiments, controller 540 and ramp voltage selector 530 may be configured to sample the supply voltage at more than two different times, for example, or just once. For example, power supply 462 may be adapted to provide a supply voltage according to a characteristic ramp profile and controller 540 may be configured to use a single sample to determine where the supply voltage is on the ramp profile and then use the ramp profile to extrapolate an appropriate POR signal delay based on the single sample (e.g., ramp voltage 538 traversing a single threshold ramp voltage). Alternatively, where power supply 462 provides a supply voltage with a non-linear and multi-variable varying/unreliable ramp profile, or where more than two supply voltage samples are beneficial to determine a reliable POR signal delay, controller 540 may be configured to determine or characterize the non-linear ramp profile based on the more than two supply voltage samples and then determine the POR signal delay based on the supply voltage samples and the characterized non-linear ramp profile.

While the embodiment of adaptive POR signal generator 500 shown in FIG. 5 includes various elements, other embodiments of adaptive POR signal generator 500 may omit reference voltage generator 510 and replace ramp voltage selector 530 and ramp traversal detector 522 with other analog or digital circuitry configured to sample the supply voltage and provide the samples and/or timing of the samples to controller 540. In addition, oscillator 550 and counter 560 may be omitted and/or replace with timing and/or clock circuitry configured to enable operation of controller 540 and adaptive POR signal generator 500. More generally, any of the individual elements of adaptive POR signal generator 500 shown in FIG. 5 may be integrated together and/or their functionality implemented with different circuit elements and arrangements of circuit elements. Particular benefits of the embodiment shown in FIG. 5 are that oscillator 550 and counter 560 may be used for both ramp time characterization and POR signal delay implementation with minimal interconnects between controller 540, oscillator 550, and counter 560. Also, reference voltage 520 is allowed to remain stable throughout the ramp characterization and POR signal generation, while ramp voltage 538 ramps, thereby ensuring repeatable and precise sampling of the supply voltage provided to input 531 throughout the ramp process.

Figure 6:
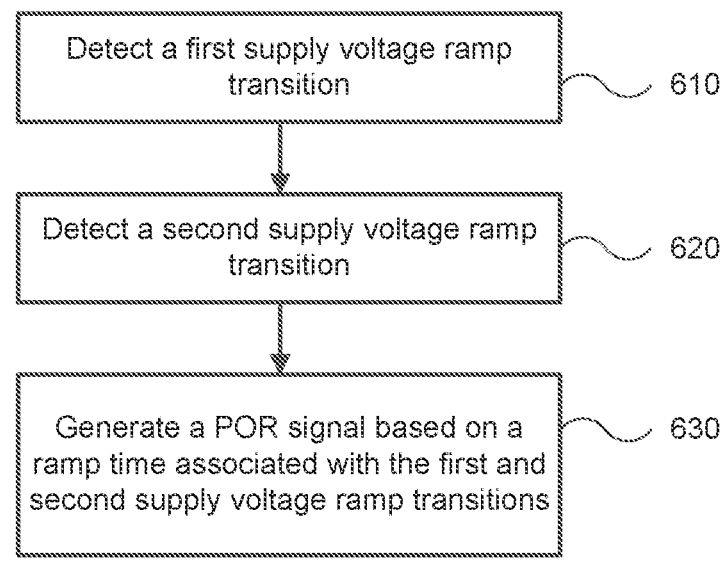
FIG. 6 illustrates an adaptive POR signal generation process in accordance with an embodiment of the disclosure.

FIG. 6 illustrates an adaptive POR signal generation process 600 in accordance with an embodiment of the disclosure. In some embodiments, the operations of FIG. 6 may be implemented as software instructions executed by one or more logic devices associated with corresponding electronic devices, modules, and/or structures depicted in FIGS. 1-5. More generally, the operations of FIG. 6 may be implemented with any combination of software instructions and/or electronic hardware (e.g., inductors, capacitors, amplifiers, actuators, or other analog and/or digital components). It should be appreciated that any step, sub-step, sub-process, or block of process 600 may be performed in an order or arrangement different from the embodiments illustrated by FIG. 6. For example, in other embodiments, one or more blocks may be omitted from process 600, and other blocks may be included. Furthermore, block inputs, block outputs, various sensor signals, sensor information, calibration parameters, and/or other operational parameters may be stored to one or more memories prior to moving to a following portion of process 600. Although process 600 is described with reference to systems, devices, and elements of FIGS. 1-5, process 600 may be performed by other systems, devices, and elements, and including a different selection of electronic systems, devices, elements, assemblies, and/or arrangements. At the initiation of process 600, various system parameters may be populated by prior execution of a process similar to process 600, for example, or may be initialized to zero and/or one or more values corresponding to typical, stored, and/or learned values derived from past operation of process 600, as described herein.

In block 610, a logic device detects a first supply voltage ramp traversal. For example, controller 540 may be configured to detect a first supply voltage ramp traversal across a first threshold ramp voltage selected via resistor bypass switch 536 of ramp voltage selector 530. For example, ramp voltage selector 530 may be configured to generate ramp voltage 538 according to the first threshold ramp voltage or the second threshold ramp voltage based on the monitored supply voltage at input 531 and how the supply voltage is modified by the switch state of resistor bypass switch 536 and linear resistor array/resistor divider 532. In some embodiments, controller 540 may be configured to detect such traversal by monitoring a ramp traversal signal generated by ramp traversal detector 522, for example, and initiating an incrementing count within counter 560 upon detecting a logic signal transition in the ramp traversal signal. Controller 540 may be configured to initiate the incrementing count by generating counter control signals to control counter 560 to count incrementally and generating clock control signals to enable oscillator 550 and control oscillator 550 to provide clock signal 552 to counter 560.

In general, ramp traversal detector 522 may be configured to receive ramp voltage 538 from ramp voltage selector 530 and provide ramp traversal signal 523 to controller 540, and counter 550 may be configured to receive counter control signals from controller 540 (e.g., via up/down signal 544, POR reset signal 574) and count incrementally and/or decrementally based, at least in part, on the counter control signals provided by controller 540. Oscillator 550 may be configured to receive clock control signals from controller 540 and provide clock signal 552 to counter 560 based, at least in part, on the clock control signals 541, 542 provided by controller 540. Controller 540 may be configured to detect the first supply voltage ramp traversal by detecting a first logic signal transition corresponding to the first supply voltage ramp traversal in ramp traversal signal 523 generated by ramp traversal detector 522 and initiating an incrementing count by counter 560.

In various embodiments, controller 540 may be configured to select the first threshold ramp voltage prior to detecting the first supply voltage ramp traversal by polling a state of bypass switch 536 of ramp voltage selector 530 and/or opening resistor bypass switch 536. Such selection may occur upon initialization of controller 540, for example, or at any time prior to detecting the first supply voltage ramp traversal. More generally, controller 540 may be configured to configure ramp voltage selector 530 according to the first threshold ramp voltage prior to detecting the first supply voltage ramp traversal by polling the switch state of resistor bypass switch 536 and/or opening resistor bypass switch 536. Ramp traversal detector 522 may be configured to generate the ramp traversal signal by determining ramp voltage 538 generated by ramp voltage selector 530 is greater than or equal to reference voltage 520 generated by reference voltage generator 510, where reference voltage 530 is lower than the nominal operating voltage associated with power supply 462 and/or the supply voltage, and by generating the first logic signal transition in ramp traversal signal 523.

In block 620, a logic device detects a second supply voltage ramp traversal. For example, controller 540 may be configured to detect a second supply voltage ramp traversal across a second threshold ramp voltage selected via resistor bypass switch 536 ramp voltage selector 530. In some embodiments, controller 540 may be configured to detect such traversal by monitoring a ramp traversal signal generated by ramp traversal detector 522, for example, and halting the incrementing count within counter 560 (e.g., initialized in block 610) upon detecting a logic signal transition in the ramp traversal signal. In various embodiments, controller 540 may be configured to select the second threshold ramp voltage subsequent to detecting the first supply voltage ramp traversal by closing resistor bypass switch 536 of ramp voltage selector 530. Such selection may occur at any time prior to detecting the second supply voltage ramp traversal. More generally, controller 540 may be configured to configure ramp voltage selector 530 according to the second threshold ramp voltage after the detecting the first supply voltage ramp traversal and/or prior to the detecting the second supply voltage ramp traversal by closing resistor bypass switch 536.

In various embodiments, controller 540 may be configured to initiate the decrementing count by generating counter control signals to control the counter to count decrementally starting at the ramp time count and by generating clock control signals to enable oscillator 550 and control oscillator 550 to provide a modified clock signal 552 to counter 560, where the modified clock signal 552 comprises a frequency based, at least in part, on the ramp time and the nominal operating voltage level. For example, such frequency may be selected to set the duration of time needed to count down to zero equal to a desired POR signal delay derived from the ramp time and the nominal operating voltage level for the supply voltage. Controller 540 may be configured to detect the second supply voltage ramp traversal by detecting a second logic signal transition corresponding to the second supply voltage ramp traversal in ramp traversal signal 523 generated by ramp traversal detector 522 and halting the incrementing count by counter 560 initiated in block 610.

In block 630, a logic generates a POR signal based, at least in part, on a ramp time associated with the first and second supply voltage ramp traversals. For example, controller 540 may be configured to generate a POR signal based, at least in part, on such ramp time and a nominal operating voltage of power supply 462, as described herein. In some embodiments, controller 540 may be configured to determine a POR signal delay based, at least in part, on the ramp time and the nominal operating voltage and to generate the POR signal after the detected second supply voltage ramp traversal and delayed relative to the detected second supply voltage ramp traversal according to the POR signal delay.

In some embodiments, controller 540 may be configured to determine such POR signal delay based, at least in part, on a linear supply voltage ramp rate corresponding to the ramp time between the first and second supply voltage ramp traversals and a voltage difference between the first and second threshold ramp voltages. In such embodiments, the POR signal delay may be determined by linear extrapolation based on the linear supply voltage ramp rate and a voltage difference between the nominal operating voltage and the second threshold ramp voltage, as described herein. In other embodiments, controller 540 may be configured to determine the POR signal delay based, at least in part, on a non-linear ramp profile associated with power supply 462 and/or the supply voltage, for example, in addition to the ramp time and the first and second threshold ramp voltages. In such embodiments, the POR signal delay may be determined by non-linear extrapolation based on such non-linear ramp profile. In various embodiments, controller 540 may be configured to adjust such POR signal delay based on a temperature of any element of user device 430, based on one or more prior stored POR signal delays, a safety margin delay buffer, and/or other POR signal delay adjustments, as described herein.

In embodiments where adaptive POR signal generator 500 is implemented with counter 560 and oscillator 550 as shown in FIG. 5, controller 540 may be configured to generate the POR signal by initiating a decrementing count by counter 560 starting at the ramp time count identified in block 620 and generating the POR signal as the decrementing count reaches zero (e.g., as conveyed to controller 540 via count signal 562). More generally, controller 540 may be configured to generate the POR signal by determining a POR signal delay based, at least in part, on the ramp time and the nominal operating voltage level and generating the POR signal after the detected second supply voltage ramp traversal and delayed relative to the detected second supply voltage ramp traversal according to the POR signal delay, as described herein. In various embodiments, controller 540 may be configured to determine the POR signal delay by linear extrapolation based, at least in part, on the linear supply voltage ramp rate and a voltage difference between the nominal operating voltage and the second threshold ramp voltage, for example, or by non-linear extrapolation based, at least in part, on a non-linear ramp profile associated with the power supply and/or the supply voltage.

Thus, by employing the systems and methods described herein, embodiments of the present disclosure are able to provide flexible and reliable protection for a PLD and/or other components of a user device during all possible power ramping levels and sequences.

Additional embodiments may include an article of manufacture comprising an integrated circuit that is coupled to receive a POR signal and a power supply that has a nominal operating voltage (an expected operating voltage, within a bounded variation under normal conditions); an adaptive POR signal generator comprising logic to detect that the power supply has become active and to measure a ramp time for the supply voltage of the power supply (or a ramp voltage derived from the supply voltage) to ramp from a low first threshold ramp voltage to a higher second threshold ramp voltage, where both the low first threshold ramp voltage and the higher second threshold ramp voltage are less than the nominal operating voltage, and the logic is configured to generate a POR signal for receipt by the integrated circuit after a POR signal delay that is based on the ramp time. In some embodiments, the POR signal delay may be based on a difference between the higher second threshold ramp voltage and the nominal operating voltage of the power supply.

Additional embodiments may also include a method comprising comparing, by a voltage comparator, a ramp voltage derived from a ramping supply voltage to detect when the ramp voltage reaches a lower first threshold ramp voltage and a higher second threshold ramp voltage, both of which are less than a nominal operating voltage of the power supply; using a ramp time between the ramp voltage reaching the lower first threshold ramp voltage and reaching the higher second threshold ramp voltage to condition generation of a POR signal provided to circuitry that is coupled to receive the supply voltage.

Additional embodiments may also include integrated circuit, comprising a counter that counts transitions in a signal; an oscillator coupled to output a clock signal to the counter; a voltage comparator coupled to a power supply to compare a reference voltage with a ramp voltage related to an instantaneous supply voltage of the power supply at first and second points in time to detect when the supply voltage (or a ramp voltage derived from the supply voltage) has reached a low first threshold ramp voltage and a higher second threshold ramp voltage; control logic coupled to the voltage comparator and to the counter, the control logic configured to receive an indicator from the voltage comparator when the supply or ramp voltage reaches the low first threshold ramp voltage, responsively to output a signal to the counter, causing the counter to begin counting, and when the supply or ramp voltage reaches the higher second threshold ramp voltage, responsively to output a signal to the counter, causing the counter to stop counting; and to use a resulting value of the counter to delay release of a POR signal an amount of time expected to elapse between the supply or ramp voltage reaching the higher second threshold ramp voltage and the supply voltage reaching a nominal operating voltage.

Additional embodiments may also include an integrated circuit that performs a method comprising estimating a slew or ramp rate of a supply voltage that is ramping from an initial voltage to a nominal operating voltage, the estimating performed before the supply voltage has reached the nominal operating voltage; generating a POR signal after elapse of a period of time determined based on the estimated ramp rate and a remaining amount of voltage increase required to reach the nominal operating voltage. Additional embodiments may also include a method performed by an integrated circuit comprising estimating a ramp rate of a power source voltage that is ramping from an initial voltage to a nominal operating voltage, the estimating performed before the supply voltage has reached the nominal operating voltage; providing a POR signal after elapse of a period of time determined based on the estimated ramp rate and a remaining amount of voltage increase required to reach the nominal operating voltage.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. An adaptive power on reset (POR) signal generator, comprising:
   a ramp voltage selector configured to monitor a supply voltage provided by a power supply and generate a ramp voltage based, at least in part, on the monitored supply voltage; and
   a logic device configured to:
      detect a first supply voltage ramp traversal across a first threshold ramp voltage based, at least in part, on the ramp voltage provided by the ramp voltage selector;
      detect a second supply voltage ramp traversal across a second threshold ramp voltage, wherein the second threshold ramp voltage is higher than the first threshold ramp voltage and the first and second threshold ramp voltages are lower than a nominal operating voltage associated with the power supply and/or the supply voltage;
      determine a time at which to generate a POR signal based, at least in part, on an amount of time between the first supply voltage ramp traversal and the second supply voltage ramp traversal; and
      generate the POR signal based on the determined time.

2. The adaptive POR signal generator of claim 1, wherein:
   the ramp voltage selector comprises a resistor bypass switch and is configured to generate the ramp voltage according to the first threshold ramp voltage or the second threshold ramp voltage based on a switch state of the resistor bypass switch; and
   the logic device is configured to:
      configure the ramp voltage selector according to the first threshold ramp voltage prior to detecting the first supply voltage ramp traversal by polling the switch state of the resistor bypass switch and/or opening the resistor bypass switch; and
      configure the ramp voltage selector according to the second threshold ramp voltage after the detecting the first supply voltage ramp traversal and/or prior to the detecting the second supply voltage ramp traversal by closing the resistor bypass switch.

3. The adaptive POR signal generator of claim 1, further comprising:
   a ramp traversal detector configured to receive the ramp voltage from the ramp voltage selector and provide a ramp traversal signal to the logic device; and
   a counter configured to receive counter control signals from the logic device and count incrementally and/or decrementally based, at least in part, on the counter control signals provided by the logic device;
wherein the detecting the first supply voltage ramp traversal comprises:
detecting a first logic signal transition corresponding to the first supply voltage ramp traversal in the ramp traversal signal generated by the ramp traversal detector; and
initiating an incrementing count by the counter; and
wherein the detecting the second supply voltage ramp traversal comprises:
detecting a second logic signal transition corresponding to the second supply voltage ramp traversal in the ramp traversal signal generated by the ramp traversal detector; and
halting the incrementing count by the counter at a ramp time count corresponding to the amount of time between the first and second supply voltage ramp traversals.

4. The adaptive POR signal generator of claim 3, further comprising a reference voltage generator configured to provide a reference voltage to the ramp traversal detector, wherein the generating the ramp traversal signal by the ramp traversal detector comprises:
determining the ramp voltage generated by the ramp voltage selector is greater than or equal to the reference voltage generated by the reference voltage generator, wherein the reference voltage is lower than the nominal operating voltage associated with the power supply and/or the supply voltage; and
generating the first logic signal transition in the ramp traversal signal.

5. The adaptive POR signal generator of claim 3, wherein the generating the POR signal comprises:
initiating a decrementing count by the counter starting at the ramp time count; and
generating the POR signal as the decrementing count reaches zero.

6. The adaptive POR signal generator of claim 5, further comprising:
an oscillator configured to receive clock control signals from the logic device and provide a clock signal to the counter based, at least in part, on the clock control signals provided by the logic device;
wherein the initiating the incrementing count by the counter comprises:
generating the counter control signals to control the counter to count incrementally; and
generating the clock control signals to enable the oscillator and control the oscillator to provide the clock signal to the counter; and
wherein the initiating the decrementing count by the counter comprises:
generating the counter control signals to control the counter to count decrementally starting at the ramp time count; and
generating the clock control signals to enable the oscillator and control the oscillator to provide a modified clock signal to the counter, wherein the modified clock signal comprises a frequency based, at least in part, on the nominal operating voltage and the amount of time between the first and second supply voltage ramp traversals.

7. The adaptive POR signal generator of claim 1, wherein the time at which to generate the POR signal is determined further based on a voltage difference between the second threshold ramp voltage and the nominal operating voltage.

8. The adaptive POR signal generator of claim 1, wherein the time at which to generate the POR signal is determined while the supply voltage is at a voltage level between the second threshold ramp voltage and the nominal operating voltage, and wherein the logic device is configured to determine the time at which to generate the POR signal
by linear extrapolation based, at least in part, on a linear supply voltage ramp rate and a voltage difference between the nominal operating voltage and the second threshold ramp voltage or by non-linear extrapolation based, at least in part, on a non-linear ramp profile associated with the power supply and/or the supply voltage.

9. A programmable logic device (PLD) comprising the adaptive POR signal generator of claim 1, wherein:
the PLD comprises a PLD fabric, a programmable input/output (I/O) interface configured to interface with a user device and/or a semiconductor device separate from the PLD over an external bus coupled to the PLD, and/or a configuration engine configured to manage configurations of and/or communications amongst the configuration engine, the PLD fabric and/or the programmable I/O interface;
the PLD is configured to receive the supply voltage provided over a power bus coupled between the PLD and the power supply;
the adaptive POR signal generator is integrated with the PLD and is configured to receive the supply voltage provided over the power bus to the PLD and to provide the generated POR signal to, and release one or more reset states of, the PLD fabric, the programmable I/O interface, and/or the configuration engine of the PLD.

10. A user device comprising the adaptive POR signal generator of claim 1, wherein:
the user device comprises the power supply, a programmable logic device (PLD), a communication module, a computing element, and/or a device module configured to implement at least a portion of a user interface, a sensor or transducer, and/or a communication bus for a smart phone, a laptop computer, a tablet computer, a desktop computer, a smart environmental sensor, a home automation device, a network management device, a smart display or television, and/or an automobile user interface;
the adaptive POR signal generator is integrated with the user device and/or an element of the user device and is configured to receive the supply voltage provided over a power bus coupled between the adaptive POR signal generator and the power supply and to provide the generated POR signal to, and release one or more reset states of, the PLD, the communication module, the computing element, and/or the device module.

11. A semiconductor device comprising the adaptive POR signal generator of claim 1, wherein:
the semiconductor device comprises one or more power domains serviced by the power supply;
the one or more power domains are configured to receive the supply voltage provided over a power bus coupled between the semiconductor device and the power supply;
the adaptive POR signal generator is integrated with the semiconductor device and is configured to receive the supply voltage provided over the power bus to the semiconductor device and to provide the generated POR signal to, and release one or more reset states of, the one or more power domains of the semiconductor device.

12. A method comprising:
- detecting a first supply voltage ramp traversal across a first threshold ramp voltage based, at least in part, on a ramp voltage generated by a ramp voltage selector based, at least in part, on a supply voltage provided by a power supply and monitored by the ramp voltage selector;
- detecting a second supply voltage ramp traversal across a second threshold ramp voltage, wherein the second threshold ramp voltage is higher than the first threshold ramp voltage and the first and second threshold ramp voltages are lower than a nominal operating voltage associated with the power supply and/or the supply voltage;
- determining a time at which to generate a POR signal based, at least in part, on an amount of time between the first supply voltage ramp traversal and the second supply voltage ramp traversal; and
- generating the POR signal based on the determined time.

13. The method of claim 12, wherein:
- the ramp voltage selector is configured to generate the ramp voltage according to the first threshold ramp voltage or the second threshold ramp voltage based on a ramp voltage select signal provided to the ramp voltage selector; and
- the method comprises:
  - configuring the ramp voltage selector according to the first threshold ramp voltage prior to the detecting the first supply voltage ramp traversal; and
  - configuring the ramp voltage selector according to the second threshold ramp voltage after the detecting the first supply voltage ramp traversal and/or prior to the detecting the second supply voltage ramp traversal.

14. The method of claim 12, wherein the detecting the first supply voltage ramp traversal comprises:
- generating, by a ramp traversal detector, a ramp traversal signal based, at least in part, on the ramp voltage generated by the ramp voltage selector;
- detecting a first logic signal transition in the ramp traversal signal generated by the ramp voltage selector that corresponds to the first supply voltage ramp traversal; and
- initiating an incrementing count by a counter.

15. The method of claim 14, wherein the generating the ramp traversal signal comprises:
- determining the ramp voltage generated by the ramp voltage selector is greater than or equal to a reference voltage generated by a reference voltage generator coupled to the ramp traversal detector, wherein the reference voltage is lower than the nominal operating voltage associated with the power supply and/or the supply voltage; and
- generating the first logic signal transition in the ramp traversal signal.

16. The method of claim 14, wherein the detecting the second supply voltage ramp traversal comprises:
- detecting a second logic signal transition in the ramp traversal signal generated by the ramp traversal detector that corresponds to the second supply voltage ramp traversal; and
- halting the incrementing count by the counter at a ramp time count corresponding to the amount of time between the first and second supply voltage ramp traversals.

17. The method of claim 16, wherein the generating the POR signal comprises:
- initiating a decrementing count by the counter starting at the ramp time count and according to a modified clock signal; and
- generating the POR signal as the decrementing count reaches zero.

18. The method of claim 12, wherein the time at which to generate the POR signal is determined further based on a voltage difference between the second threshold ramp voltage and the nominal operating voltage.

19. The method of claim 12, wherein the time at which to generate the POR signal is determined while the supply voltage is at a voltage level between the second threshold ramp voltage and the nominal operating voltage, and wherein the determining the time at which to generate the POR signal comprises:
- determining the time at which to generate the POR signal by linear extrapolation based, at least in part, on a linear supply voltage ramp rate and a voltage difference between the nominal operating voltage and the second threshold ramp voltage or by non-linear extrapolation based, at least in part, on a non-linear ramp profile associated with the power supply and/or the supply voltage.

20. The method of claim 12, further comprising:
- receiving the supply voltage via a power bus coupled between the power supply and a programmable logic device (PLD), a communication module, a computing element, a device module, and/or a semiconductor device; and
- providing the generated POR signal to, and releasing one or more reset states of, the PLD, the communication module, the computing element, the device module, and/or one or more power domains of the semiconductor device.

* * * * *